(12) United States Patent
Ishikawa

(10) Patent No.: US 7,276,964 B2
(45) Date of Patent: Oct. 2, 2007

(54) PWM POWER AMPLIFIER AND METHOD FOR CONTROLLING THE SAME

(75) Inventor: Chitoshi Ishikawa, Tokyo (JP)

(73) Assignee: Sony Corporation, Tokyo (JP)

( * ) Notice: Subject to any disclaimer, the term of this patent is extended or adjusted under 35 U.S.C. 154(b) by 124 days.

(21) Appl. No.: 11/260,405

(22) Filed: Oct. 28, 2005

(65) Prior Publication Data
US 2006/0158245 A1 Jul. 20, 2006

(30) Foreign Application Priority Data
Nov. 17, 2004 (JP) .............................. 2004-333323

(51) Int. Cl.
*H03F 3/38* (2006.01)
(52) U.S. Cl. ...................................................... 330/10
(58) Field of Classification Search ................ 381/94.5, 381/94.8, 121; 332/109, 162
See application file for complete search history.

(56) References Cited

U.S. PATENT DOCUMENTS 6,552,606 B1 * 4/2003 Veltman et al. ............... 330/10

2006/0181346 A1 * 8/2006 Nguyen ....................... 330/251

* cited by examiner

*Primary Examiner*—Robert Pascal
*Assistant Examiner*—Alan Wong
(74) *Attorney, Agent, or Firm*—Oblon, Spivak, McClelland, Maier & Neustadt, P.C.

(57) ABSTRACT

The present invention provides a PWM power amplifier and a method for controlling the same which can improve the sound quality significantly in real time. There is provided a PWM power amplifier and a method for controlling the same that PWM-power-amplifies an input audio signal to supply thus amplified audio signal to a speaker, which power-amplifies the audio signal, removes high frequency signal components included in the audio signal which is power-amplified, detects a distortion error raised in the audio signal which has its high frequency signal components removed based on the audio signal just about to be power-amplified, adjusts a voltage supplied from an external power source depending on a detected distortion error, and adjusts a voltage to be supplied at the time of the power amplification by a value corresponding to the distortion error so as to reduce the output impedance of the audio signal which has its high frequency signal components removed.

5 Claims, 3 Drawing Sheets

PWM POWER AMPLIFIER AND METHOD FOR CONTROLLING THE SAME

CROSS REFERENCES TO RELATED APPLICATIONS

The present invention contains subject matter related to Japanese Patent Application JP 2004-333323 filed in the Japanese Patent Office on Nov. 17, 2004, the entire contents of which being incorporated herein by reference.

BACKGROUND OF THE INVENTION

1. Field of the Invention

The present invention relates to a PWM power amplifier and a method for controlling the same, which are desirably employed in an audio instrument such as a Compact Disc (CD) player.

2. Description of the Related Art

In the past, in a CD player of this type, after performing the Pulse Width Modulation (PWM) processing for an audio signal reproduced from a CD, a PWM power amplifier amplifies thus obtained PWM signal based on a power voltage supplied from a household power source to send a power of thus amplified signal to a speaker (for example, refer to Japanese Utility Model Laid-Open Publication No. 5-70017).

FIG. 1 shows a block diagram of a PWM power amplifier that has been known in the art (for example, refer to Japanese Utility Model Laid-Open Publication No. 5-70017). In the PWM power amplifier 1, a PWM signal S1 that is an input digital audio signal is converted to a signal of a predetermined format by a format conversion unit 2, and thus converted signal is sent to a processor 3.

The processor 3 divides a PWM signal S1' into a positive side signal S2A and a negative side signal S2B, and sends thus divided respective signals to a power output unit 5.

The power output unit 5 is of the Baranced Transformerless (BTL) connection configuration, which power-amplifies the positive side signal S2A and negative side signal S2B sent from the processor 3 using a Direct Current (DC) voltage supplied from a power source 6, and sends thus amplified signals to a speaker 8 through a pair of Low Pass Filters's (LPF) 7A, 7B, composed of coils $L_{7A}$, $L_{7B}$ and capacitors $C_{7A}$, $C_{7B}$, for removing high frequency signal components.

The power source 6 converts an Alternating Current (AC) voltage supplied from a household power source, not shown, arranged at the outside to a DC voltage, and adjusts the voltage level of the DC voltage to be supplied to the power output unit 5 based on a volume value adjusted under the operation of the user.

SUMMARY OF THE INVENTION

On the other hand, in the PWM power amplifier 1, since the PWM signal S1 being a digital signal is sent to the power output unit 5 after being divided into the positive side signal S2A and negative side signal S2B by the processor 3, there is raised a large time delay accordingly, which makes it difficult to perform the negative feedback control for the digital signal directly. Accordingly, there is brought about a problem that low frequency signal components of the signal come to be significantly disadvantageous in sound quality as compared with the case of employing an analog power amplifier.

It is therefore desirable to overcome the above-mentioned drawbacks by providing a PWM power amplifier and a method for controlling the same which can improve the sound quality significantly in real time.

According to the present invention, there is provided a PWM power amplifier that PWM-power-amplifies an input audio signal to supply thus amplified audio signal to a speaker, which includes a power amplification means for power-amplifying the audio signal, a filter means for removing high frequency signal components included in the audio signal sent from the power amplification means, a distortion detection means for detecting a distortion error raised in the audio signal sent from the filter means based on the audio signal just about to be supplied to the power amplification means, and a voltage adjustment means for adjusting a voltage supplied from an external power source depending on a distortion error detected by the distortion detection means, wherein the voltage adjustment means adjusts a voltage to be supplied to the power amplification means by a value corresponding to the distortion error so as to reduce the output impedance of the filter means.

As a result, in the PWM power amplifier, since a voltage to be supplied to the power amplification means is controlled depending on a distortion error, the output impedance of the filter means as well as the distortion and S/N can be reduced, and indirectly, the negative feedback control can be performed for an audio signal sent from the power amplification means through the filter means as if the audio signal is an analog signal.

According to the present invention, there is also provided a method for controlling a PWM power amplifier that PWM-power-amplifies an input audio signal to supply thus amplified audio signal to a speaker, which power-amplifies the audio signal, removes high frequency signal components included in the audio signal which is power-amplified, detects a distortion error raised in the audio signal which has its high frequency signal components removed based on the audio signal just about to be power-amplified, adjusts a voltage supplied from an external power source depending on a detected distortion error, and adjusts a voltage to be supplied at the time of the power amplification by a value corresponding to the distortion error so as to reduce the output impedance of the audio signal which has its high frequency signal components removed.

As a result, in the method for controlling a PWM power amplifier, since a voltage to be supplied at the time of the power amplification is controlled depending on a distortion error, the output impedance of an audio signal which has its high frequency signal components removed as well as the distortion and S/N can be reduced, and indirectly, the negative feedback control can be performed for an audio signal which is power-amplified and has its high frequency signal components removed as if the audio signal is an analog signal.

According to the present invention, since there is provided a PWM power amplifier that PWM-power-amplifies an input audio signal to supply thus amplified audio signal to a speaker, which includes a power amplification means for power-amplifying the audio signal, a filter means for removing high frequency signal components included in the audio signal sent from the power amplification means, a distortion detection means for detecting a distortion error raised in the audio signal sent from the filter means based on the audio signal just about to be supplied to the power amplification means, and a voltage adjustment means for adjusting a voltage supplied from an external power source depending on a distortion error detected by the distortion detection means, wherein the voltage adjustment means adjusts a voltage to be supplied to the power amplification means by a value corresponding to the distortion error so as to reduce the output impedance of the filter means, indirectly, the negative feedback control can be performed for an audio signal sent from the power amplification means through the filter means as if the audio signal is an analog signal, thereby realizing a PWM power amplifier that can improve the sound quality significantly in real time.

According to the present invention, since there is also provided a method for controlling a PWM power amplifier that PWM-power-amplifies an input audio signal to supply thus amplified audio signal to a speaker, which power-amplifies the audio signal, removes high frequency signal components included in the audio signal which is power-amplified, detects a distortion error raised in the audio signal which has its high frequency signal components removed based on the audio signal just about to be power-amplified, adjusts a voltage supplied from an external power source depending on a detected distortion error, and adjusts a voltage to be supplied at the time of the power amplification by a value corresponding to the distortion error so as to reduce the output impedance of the audio signal which has its high frequency signal components removed, indirectly, the negative feedback control can be performed for an audio signal which is power-amplified and has its high frequency signal components removed as if the audio signal is an analog signal, thereby realizing a method for controlling a PWM power amplifier that can improve the sound quality significantly in real time.

DETAILED DESCRIPTION OF THE PREFERRED EMBODIMENTS

The present invention will be described below with reference to the accompanying drawings.

(1) Configuration of a PWM Power Amplifier of the Present Embodiment

Figure 1:
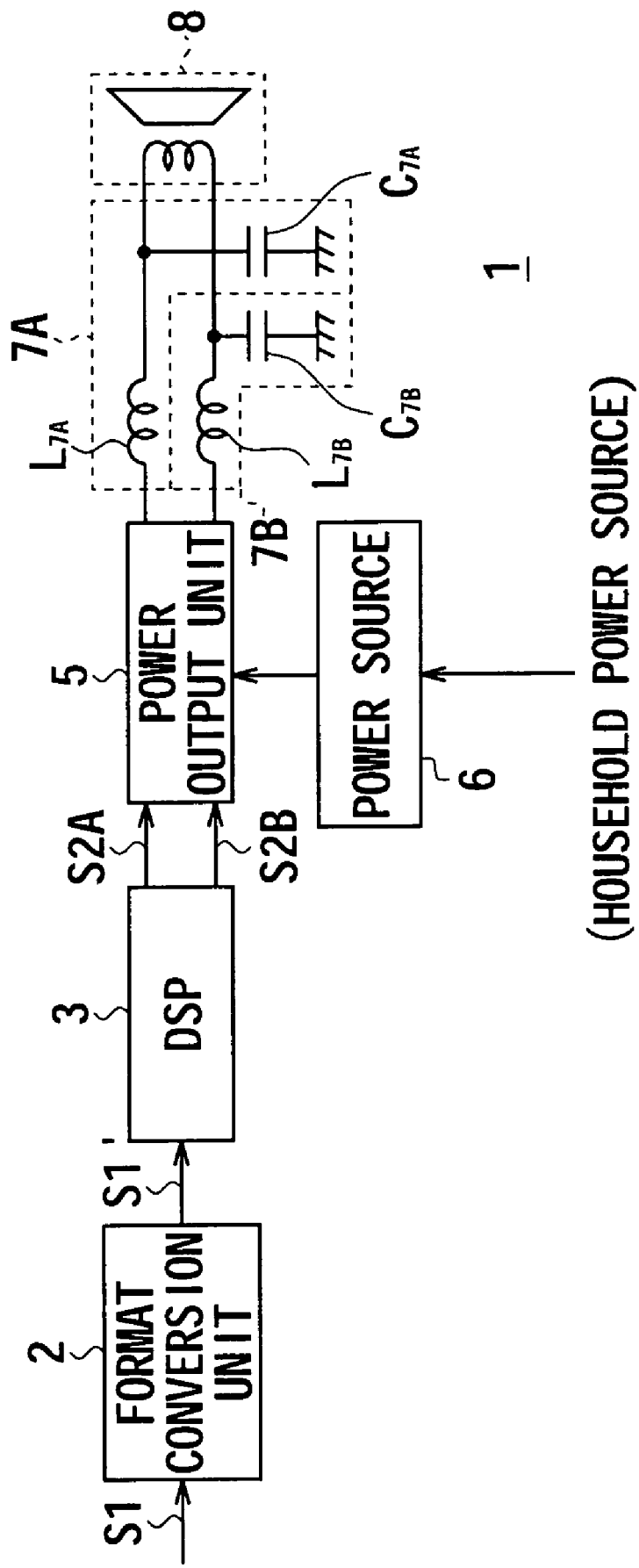
FIG. 1 shows a block diagram of a PWM power amplifier in related art.
Figure 2:
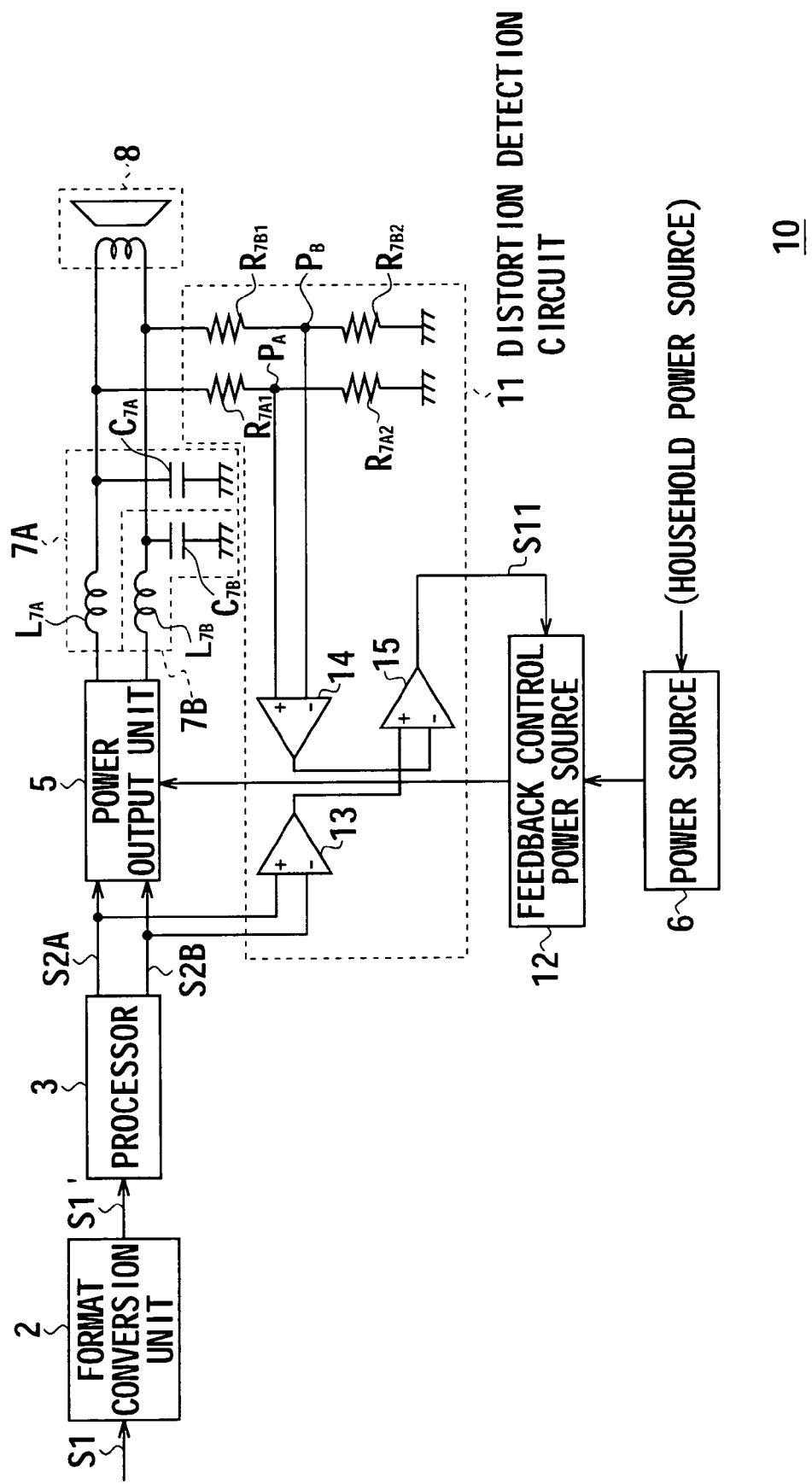
FIG. 2 shows a block diagram of a PWM power amplifier of the present embodiment.

FIG. 2 shows a block diagram of a PWM power amplifier 10 of the present embodiment, in which parts or components similar to those of the PWM power amplifier 1 shown in FIG. 1 are indicated with the same reference numerals. The configuration of the PWM power amplifier 10 shown in FIG. 2 is similar to that of the PWM power amplifier 1 shown in FIG. 1 except that there are arranged a distortion detection circuit 11 for reducing the output impedance of the pair of low pass filters 7A, 7B by performing the negative feedback control between the output stage of the processor 3 and the subsequent stage of the respective low pass filters 7A, 7B, and a feedback control power source 12 for adjusting a voltage to be supplied to the power output unit 5 depending on the detection result of the distortion detection circuit 11.

In the PWM power amplifier 10, a PWM signal S1 that is an input digital audio signal is converted to a signal of a predetermined format by the format conversion unit 2, and thus converted signal is sent to the processor 3. The processor 3 divides a PWM signal S1' into a positive side signal S2A and a negative side signal S2B, and sends thus divided respective signals to the power output unit 5.

The power output unit 5 is of the BTL connection configuration, which power-amplifies the positive side signal S2A and negative side signal S2B sent from the processor 3 using a DC voltage supplied from the power source 6, and sends thus amplified signals to the speaker 8 through the pair of low pass filters 7A, 7B, composed of coils and capacitors, for removing high frequency signal components.

The feedback control power source 12 is supplied with a DC voltage that is obtained by converting an AC voltage supplied from an outside household power source, not shown, at the power source 6, and adjusts the voltage level of the DC voltage to be supplied to the power output unit 5 based on a volume value adjusted under the operation of the user.

The distortion detection circuit 11 includes a first operational amplifier 13 provided with the low pass filter function of acquiring the difference between signal voltages of the positive side signal S2A and negative side signal S2B sent from the processor 3, a second operational amplifier 14 provided with the low pass filter function of acquiring the difference between outputs of the pair of low pass filters 7A, 7B, and a third operational amplifier 15 working as a comparison circuit for comparing outputs of the first operational amplifier 13 and the second operational amplifier 14.

The first operational amplifier 13 has its one input end and the other input end connected to connection points between the processor 3 and the power output unit 5 respectively, and has its output end connected to one input end of the third operational amplifier 15.

The second operational amplifier 14 has its one input end and the other input end connected to output ends of the pair of low pass filters 7A, 7B through first resistors $R_{7A1}$, $R_{7B1}$, and has these input ends and corresponding connection points $P_A$, $P_B$, to which the respective resistors are connected, grounded through second resistors $R_{7A2}$, $R_{7B2}$, respectively. The first resistors $R_{7A1}$, $R_{7B1}$ and second resistors $R_{7A2}$, $R_{7B2}$ voltage-divide the positive side signal S2A and negative side signal S2B amplified in the power output unit 5 by values corresponding to the amplification.

The third operational amplifier 15 has its one input end connected to the output end of the first operational amplifier 13, and has its other input end connected to the output end of the second operational amplifier 14, and has its output end connected to the feedback control power source 12.

Specifically, in the distortion detection circuit 11, the third operational amplifier 15 compares the difference between signal voltages of the positive side signal S2A and negative side signal S2B sent from the processor 3, which is output from the first operational amplifier 13, and the difference between outputs of the pair of low pass filters 7A, 7B, which is output from the second operational amplifier 14, and then supplies the comparison result to the feedback control power source 12 as an error signal S11.

The feedback control power source 12 adjusts a voltage to be supplied to the power output unit 5 in the feedback manner based on the error signal S11 supplied from the third operational amplifier 15 so as to change the output gain of the power output unit 5.

Figure 3:
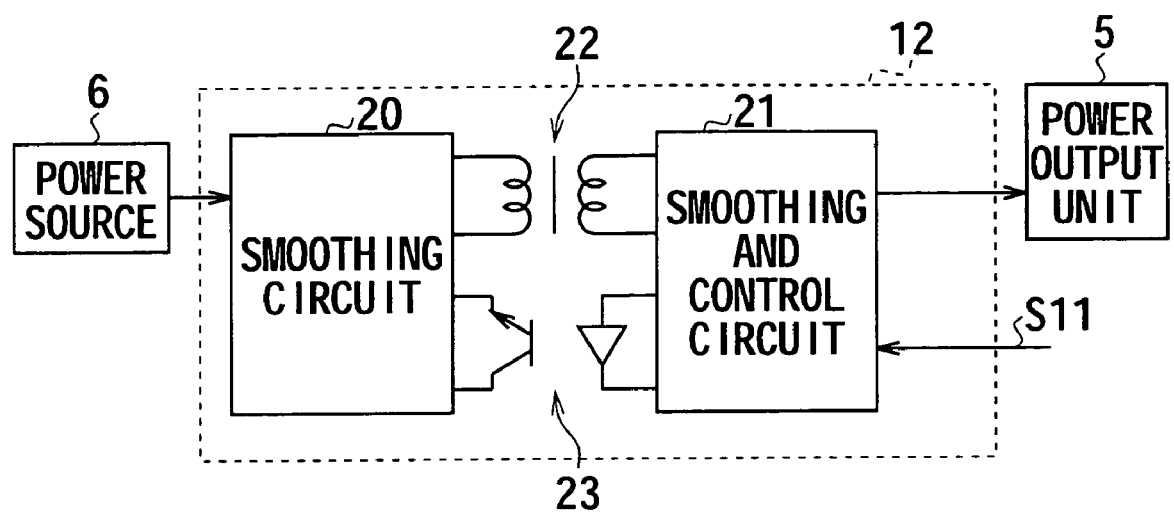
FIG. 3 shows a block diagram of a feedback control power source shown in FIG. 2.

In the feedback control power source 12, a smoothing circuit 20 for removing AC components from a DC voltage supplied from the power source 6, and a smoothing and control circuit 21 for receiving the error signal S11 from the third operational amplifier 15 to supply a voltage to the power output unit 5 are connected to each other through a power transformer 22 and a photo-sensor 23, as shown in FIG. 3.

In the smoothing and control circuit 21, when the error signal S11 is supplied, the time constant within the inner circuit can be reduced. As a result, a voltage that is obtained by adjusting a DC voltage supplied from the power source 6 can be supplied to the power output unit 5 fast by just that much.

Accordingly, in the PWM power amplifier 10, after the PWM signal S1 that is a digital audio signal is amplified based on a power voltage supplied from a household power source, the output impedance of the pair of low pass filters 7A, 7B which are coupled to the output stage of the power output unit 5 is reduced based on the negative feedback control by the distortion detection circuit 11, thereby making it possible to supply a power having its distortion and S/N reduced to the speaker 8.

(2) Operation and Effect by the Present Embodiment

According to above-described configuration, in the PWM power amplifier 10, after the PWM signal S1' that is an audio signal is divided into the positive side signal S2A and negative side signal S2B by the processor 3, and thus generated positive side signal S2A and negative side signal S2B are amplified by the power output unit 5 based on a power voltage supplied from the power source 6, thereby supplying the power to the speaker 8.

At this time, the distortion detection circuit 11 detects an error of signal voltages between the amplified positive side signal S2A and negative side signal S2B sent from the pair of low pass filters 7A, 7B which are coupled to the output stage of the power output unit 5, and the positive side signal S2A and negative side signal S2B sent from the processor 3. Then, the feedback control power source 12 changes a voltage supplied from the power source 6 by a value corresponding to the error based on the detection result of the distortion detection circuit 11, and then supplies thus changed voltage to the power output unit 5.

As a result, since currents of the amplified positive side signal S2A and negative side signal S2B sent from the power output unit 5 are significantly large, even though the impedance of the pair of low pass filters 7A, 7B which are coupled to the output stage of the power output unit 5 is large, the impedance can be reduced by a value corresponding to the changed output voltage of the power output unit 5, which can reduce the distortion and S/N raised in a power to be supplied to the speaker 8.

Thus, in the PWM power amplifier 10, since the feedback control power source 12 controls a voltage to be supplied to the power output unit 5 depending on the detection result of the distortion detection circuit 11, indirectly, the negative feedback control can be performed for the positive side signal S2A and negative side signal S2B sent from the power output unit 5 through the pair of low pass filters 7A, 7B as if the positive side signal S2A and negative side signal S2B are analog signals.

According to above-describe configuration, in the PWM power amplifier 10, after the distortion detection circuit 11 detects a distortion error raised in the amplified positive side signal S2A and negative side signal S2B sent from the pair of low pass filters 7A, 7B which are coupled to the output stage of the power output unit 5, the feedback control power source 12 performs the negative feedback control for a power voltage supplied from the power source 6 to reduce a voltage to be supplied to the power output unit 5 by a value corresponding to the distortion error. Accordingly, distortion and S/N can be prevented from occurring in a power to be supplied to the speaker 8 by a value corresponding to the reduced output impedance of the respective low pass filters 7A, 7B, thereby realizing the PWM power amplifier 10 that can significantly improve the sound quality in real time.

(3) Configuration of Another Embodiment

In above-described present embodiment, the present invention is applied to the PWM power amplifier 10 shown in FIG. 2. On the other hand, the present invention is not restricted to this, and can be widely applied to PWM power amplifiers of various configurations other than this so long as an input audio signal (PWM signal S1) is power-amplified to be supplied to the speaker 8.

Furthermore, in above-described present embodiment, a power amplification means that PWM-power-amplifies an audio signal is configured by the power output unit 5 which is of the BTL connection configuration, and a filter means that removes high frequency signal components included in a PWM-power-amplified audio signal sent from the power output unit (power amplification section) 5 is configured by the respective low pass filters 7A, 7B composed of coils $L_{7A}$, $L_{7B}$ and capacitors $C_{7A}$, $C_{7B}$. On the other hand, the present invention is not restricted to this, and can be widely applied to power amplification means and filter means of various configurations other than these.

Furthermore, in above-described present embodiment, a distortion detection means that detects a distortion error raised in an audio signal sent from the respective low pass filters (filter means) 7A, 7B based on an audio signal just about to be supplied to the power output unit (power amplification means) 5 is configured by the first resistors and second resistors (voltage-reduction means) $R_{7A1}$, $R_{7B1}$, $R_{7A2}$, $R_{7B2}$ which reduce the voltage by a value corresponding to the amplified power, and the third operational amplifier (difference detection section) 15 that detects the difference between outputs of the processor 3 and the respective low pass filters (filter means) 7A, 7B. On the other hand, the present invention is not restricted to this, and can be widely applied to distortion detection means of various configurations other than this.

Furthermore, in above-described present embodiment, a voltage adjustment means that adjusts a voltage supplied from an external power source depending on a distortion error detected by the distortion detection circuit (distortion detection means) 11 is configured by the feedback control power source 12 and the power source 6. On the other hand, the present invention is not restricted to this, and a single power source of high speed control type, not shown, including the function of the feedback control power source 12 can be employed so long as a power to be supplied to the power output unit (power amplification means) 5 can be adjusted by a value corresponding to the distortion error.

As in the above, the PWM power amplifier and method for controlling the same can be desirably employed in an audio instrument such as a CD player etc. or a cellular phone.

It should be understood by those skilled in the art that various modifications, combinations sub-combinations and alterations may occur depending on design requirements and other factors insofar as they are within the scope of the appended claims or the equivalents thereof.

What is claimed is:

1. A PWM power amplifier that PWM-power-amplifies an input audio signal to supply thus amplified audio signal to a speaker, comprising:

power amplification means for power-amplifying the audio signal;

filter means for removing high frequency signal components included in the audio signal sent from the power amplification means;

distortion detection means for detecting a distortion error raised in the audio signal sent from the filter means based on the audio signal just about to be supplied to the power amplification means; and voltage adjustment means for adjusting a voltage supplied from an external power source depending on a distortion error detected by the distortion detection means, wherein the voltage adjustment means adjusts a voltage to be supplied to the power amplification means by a value corresponding to the distortion error so as to reduce the output impedance of the filter means.

2. The PWM power amplifier according to claim 1, wherein the distortion detection means includes:

voltage-reduction means for reducing the signal voltage of the audio signal sent from the filter means by a value corresponding to the amplified power, and difference detection means for detecting the difference between the audio signal just about to be supplied to the power amplification means and the audio signal sent from the filter means through the voltage-reduction means.

3. A method for controlling a PWM power amplifier that PWM-power-amplifies an input audio signal to supply thus amplified audio signal to a speaker, comprising:

a first step of power-amplifying the audio signal;

a second step of removing high frequency signal components included in the audio signal which is power-amplified;

a third step of detecting a distortion error raised in the audio signal which has its high frequency signal components removed based on the audio signal just about to be power-amplified;

a fourth step of adjusting a voltage supplied from an external power source depending on a detected distortion error; and a fifth step of adjusting a voltage to be supplied at the time of the power amplification by a value corresponding to the distortion error so as to reduce the output impedance of the audio signal which has its high frequency signal components removed.

4. The method for controlling a PWM power amplifier according to claim 3, wherein in the third step, the signal voltage of the audio signal which has its high frequency signal components removed is reduced by a value corresponding to the amplified power, and then the difference between the audio signal just about to be power-amplified and the audio signal which has its high frequency signal components removed is detected.

5. A PWM power amplifier that PWM-power-amplifies an input audio signal to supply thus amplified audio signal to a speaker, comprising:

a power amplification unit that power-amplifies the audio signal;

a filter unit that removes high frequency signal components included in the audio signal sent from the power amplification unit;

a distortion detection unit that detects a distortion error raised in the audio signal sent from the filter unit based on the audio signal just about to be supplied to the power amplification unit; and a voltage adjustment unit that adjusts a voltage supplied from an external power source depending on a distortion error detected by the distortion detection unit, wherein the voltage adjustment unit adjusts a voltage to be supplied to the power amplification unit by a value corresponding to the distortion error so as to reduce the output impedance of the filter unit.

\* \* \* \* \*